US012800641B2

(12) United States Patent
Yagi et al.

(10) Patent No.: US 12,800,641 B2
(45) Date of Patent: Nov. 17, 2026

(54) METHOD FOR ESTIMATING PARTIAL DISCHARGE FACTOR OF POWER SEMICONDUCTOR MODULE, AND DEVICE FOR ESTIMATING PARTIAL DISCHARGE FACTOR OF POWER SEMICONDUCTOR MODULE

(71) Applicant: Minebea Power Semiconductor Device Inc., Ibaraki (JP)

(72) Inventors: Daisuke Yagi, Tokyo (JP); Kazuaki Naoe, Tokyo (JP); Junpei Kusukawa, Tokyo (JP); Shun Sakurai, Tokyo (JP); Akihiro Muramoto, Hitachi (JP)

(73) Assignee: MINEBEA POWER SEMICONDUCTOR DEVICE INC., Ibaraki (JP)

( * ) Notice: Subject to any disclaimer, the term of this patent is extended or adjusted under 35 U.S.C. 154(b) by 155 days.

(21) Appl. No.: 18/836,846

(22) PCT Filed: Nov. 8, 2022

(86) PCT No.: PCT/JP2022/041486
§ 371 (c)(1),
(2) Date: Aug. 8, 2024

(87) PCT Pub. No.: WO2023/171037
PCT Pub. Date: Sep. 14, 2023

(65) Prior Publication Data

US 2025/0027983 A1 Jan. 23, 2025

(30) Foreign Application Priority Data

Mar. 11, 2022 (JP) ................................ 2022-038251

(51) Int. Cl.
*G01R 31/12* (2020.01)

(52) U.S. Cl.
CPC ................................ *G01R 31/129* (2013.01)

(58) Field of Classification Search
CPC ...... G01R 31/129; G01R 31/26; G01R 31/40; G01R 31/12
See application file for complete search history.

(56) References Cited

U.S. PATENT DOCUMENTS

2003/0151412 A1* 8/2003 Gregory ............ G01R 31/1272 324/536
2005/0285604 A1* 12/2005 Shinohara .......... G01R 31/1281 324/557
(Continued)

FOREIGN PATENT DOCUMENTS

JP 05-256895 A 10/1993
JP 11-237430 A 8/1999
(Continued)

OTHER PUBLICATIONS

International Search Report of PCT/JP2022/041486 dated Jan. 10, 2023.

*Primary Examiner* — Alvaro E Fortich
(74) *Attorney, Agent, or Firm* — MATTINGLY & MALUR, PC

(57) ABSTRACT

A method for estimating a partial discharge factor of a power semiconductor module which is capable of automatically estimating a partial discharge factor is provided using time-series data of a quantity of charge discharged during a partial discharge test. The method includes: a measurement step of applying, to the power semiconductor module, a test voltage pattern in which a voltage pattern changes, and measuring a quantity of charge that is due to partial discharge of the power semiconductor module; a feature quantity extraction step of extracting a plurality of feature quantities including at least a first feature quantity that is an average value of a quantity of charge in a first time period and a second feature (Continued)

quantity that is an average value of a quantity of charge in a second time period; and an estimation step of estimating the partial discharge factor based on the plurality of feature quantities.

11 Claims, 9 Drawing Sheets

(56) References Cited

U.S. PATENT DOCUMENTS

| | | | | |
|---|---|---|---|---|
| 2016/0282403 | A1* | 9/2016 | Hanawa ............. | G01R 31/1272 |
| 2021/0231747 | A1* | 7/2021 | Yamada ................. | G01R 31/58 |
| 2023/0408572 | A1 | 12/2023 | Muramatsu et al. | |

FOREIGN PATENT DOCUMENTS

| | | | |
|---|---|---|---|
| JP | 2013-134156 | A | 7/2013 |
| JP | 2013-142673 | A | 7/2013 |
| JP | 2016-212052 | A | 12/2016 |
| JP | 2017-022310 | A | 1/2017 |
| JP | 2018-185223 | A | 11/2018 |
| JP | 2019-191142 | A | 10/2019 |
| WO | 2022/164663 | A1 | 8/2022 |
| WO | 2022/190768 | A1 | 9/2022 |

* cited by examiner

METHOD FOR ESTIMATING PARTIAL DISCHARGE FACTOR OF POWER SEMICONDUCTOR MODULE, AND DEVICE FOR ESTIMATING PARTIAL DISCHARGE FACTOR OF POWER SEMICONDUCTOR MODULE

TECHNICAL FIELD

The present invention relates to a test method and a test device for a power semiconductor module, and particularly relates to an effective technique applied to a partial discharge test.

BACKGROUND ART

The power semiconductor module is widely used in various fields, such as electric vehicles, electric railways, and renewable energy generation systems, and is required to have higher durability and reliability.

One of causes of failure of the power semiconductor modules is dielectric breakdown caused by partial discharge. The partial discharge is weak discharge (corona discharge) that occurs in a defective part of an insulator, and progresses degradation of the insulator. In a case where partial discharge occurs at a drive voltage, the partial discharge may shorten the life of a product and lead to sudden failure or destruction. Therefore, it is important that a latent defect that cannot be found in other withstand voltage tests is detected in the partial discharge test, and the detection is very effective to evaluate the insulation reliability of the power semiconductor module.

As a background technique in the present technical field, for example, there is such a technique as described in Patent Literature 1. Patent Literature 1 discloses a partial discharge measurement system that can be used to identify a location and a factor of partial discharge in diagnosis of degradation of insulation in a high-voltage device.

CITATION LIST

Patent Literature

Patent Literature 1: Japanese Unexamined Patent Application Publication No. 2018-185223

SUMMARY OF INVENTION

Technical Problem

Multiple factors causing partial discharge in the power semiconductor module are conceivable. However, it takes time and effort to disassemble and analyze the power semiconductor module, and it takes a considerable amount of time and cost to identify a factor causing the partial discharge.

In the power semiconductor module, soft resin and hard resin are used as insulation materials. However, in a case where a void (bubble) is present in the soft resin, there is a high possibility that the size of the void may decrease over time. However, in a case where a void is present in the hard resin, the size of the void of the hard resin hardly depends on time. Based on the principle of partial discharge, there is a correlation between the size of a void and the quantity of charge discharged. By measuring the quantity of charge discharged during the partial discharge test, it is possible to identify a factor causing partial discharge. However, as described above, in a case where the state of a void present changes over time depending on the material, it is difficult to identify a factor causing partial discharge.

In the above-described Patent Literature 1, there is no description regarding measurement for determining a void depending on time and a void not depending on time, and, for example, it is difficult to determine whether partial charge occurs in a soft resin portion or a hard resin portion.

An object of the present invention is to provide a method for estimating a partial discharge factor of the power semiconductor module, and a device for estimating the partial discharge factor of the power semiconductor module, which are capable of easily and automatically estimating the partial discharge factor using time-series data of a quantity of charge discharged during the partial discharge test.

Solution to Problem

In order to solve the above-described problem, according to the present invention, a method for estimating the partial discharge factor of the power semiconductor module during the partial discharge test for the power semiconductor module includes: (a) a measurement step of applying, to the power semiconductor module, a test voltage pattern in which a voltage pattern changes, and measuring an quantity of charge that is due to partial discharge of the power semiconductor module; (b) a feature quantity extraction step of extracting a plurality of feature quantities including at least a first feature quantity that is an average value of a quantity of charge in a first time period and a second feature quantity that is an average value of a quantity of charge in a second time period; and (c) an estimation step of estimating the partial discharge factor based on the plurality of feature quantities.

In addition, according to the present invention, the device for estimating the partial discharge factor of the power semiconductor module that estimates the partial discharge factor during the partial discharge test for the power semiconductor module includes: a voltage applying unit that applies, to the power semiconductor module, a test voltage pattern in which a voltage pattern changes; a current measurement unit that measures a quantity of charge that is due to partial discharge of the power semiconductor module; a feature quantity calculation unit that extracts a plurality of feature quantities including at least a first feature quantity that is an average value of a quantity of charge in a first time period and a second feature quantity that is an average value of a quantity of charge in a second time period; and a factor classification unit that estimates the partial discharge factor based on the plurality of feature quantities extracted by the feature quantity calculation unit.

Advantageous Effects of Invention

According to the present invention, a method for estimating the partial discharge factor of the power semiconductor module, and the device for estimating the partial discharge factor of the power semiconductor module, which are capable of easily and automatically estimating the partial discharge factor, can be realized by using time-series data of a quantity of charge discharged during a partial discharge test.

Therefore, it is possible to improve the durability and reliability of the power semiconductor module.

Objects, configurations, and effects other than the above will be apparent from the description of the following embodiments.

DESCRIPTION OF EMBODIMENTS

Hereinafter, embodiments of the present invention will be described with reference to the drawings. In each of the drawings, the same components are denoted by the same reference signs, and a detailed description about redundant parts is omitted.

First Embodiment

Figure 8:
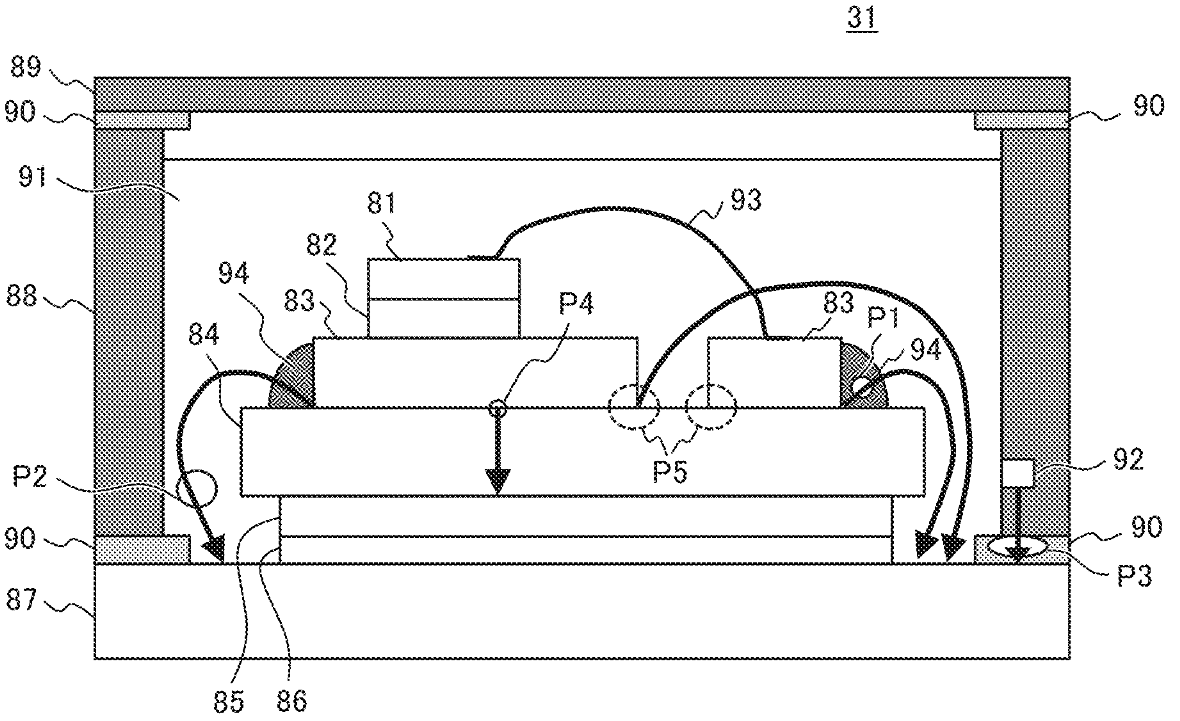
FIG. 8 is a diagram illustrating an example of partial discharge of the power semiconductor module.

First, partial discharge of the power semiconductor module will be described with reference to FIG. 8. FIG. 8 is a diagram illustrating an example of partial discharge of a representative power semiconductor module 31.

The power semiconductor module 31 includes a semiconductor chip 81 having an insulated gate bipolar transistor (IGBT), a diode, and the like, as illustrated in FIG. 8. A back surface of the semiconductor chip 81 is bonded to metal wire 83 on a front surface of an insulating substrate 84 by solder 82. A front surface of the semiconductor chip 81 is connected to bonding wire 93 and connected to other metal wire 83 and the like on the front surface of the insulating substrate 84 via the bonding wire 93.

Meanwhile, metal wire 85 on a back surface of the insulating substrate 84 is bonded to a heat dissipation base plate 87 by solder 86. A casing 88 and a lid 89 are adhesively fixed to the heat dissipation base plate 87 by an adhesive 90 so as to cover the semiconductor chip 81, the metal wire 83, the insulating substrate 84, and the metal wire 85. An auxiliary terminal 92 is disposed in the casing 88.

A gap between the heat dissipation base plate 87, the casing 88, and the lid 89, and the semiconductor chip 81, the metal wires 83, the insulating substrate 84 and the metal wires 85 is filled with a soft resin 91 in order to insulate the inside of the power semiconductor module 31. In addition, in order to increase insulation, a hard resin 94 is disposed at an end portion of the metal wire 83 on the front surface of the insulating substrate 84 on which an electric field tends to concentrate.

In general, the heat dissipation base plate 87 is at a ground potential. Thus, when a drive voltage is applied to the power semiconductor module 31, an electric field directed in a direction indicated by an arrow in FIG. 8 occurs.

In this case, for example, in a case where voids (bubbles) are present in the hard resin 94, the soft resin 91, and the adhesive 90, partial discharge P1 to P3 may occur.

In addition, in a case where a void or a gap is present between the metal wire 83 and the insulating substrate 84, partial discharge P4 may occur.

Further, partial discharge P5 may occur at an end portion of the metal wire 83 where the hard resin 94 is not disposed.

Next, a method for estimating the partial discharge factor of the power semiconductor module and the device for estimating the partial discharge factor of the power semiconductor module according to a first embodiment of the present invention will be described with reference to FIGS. 1 to 4.

Figure 1:
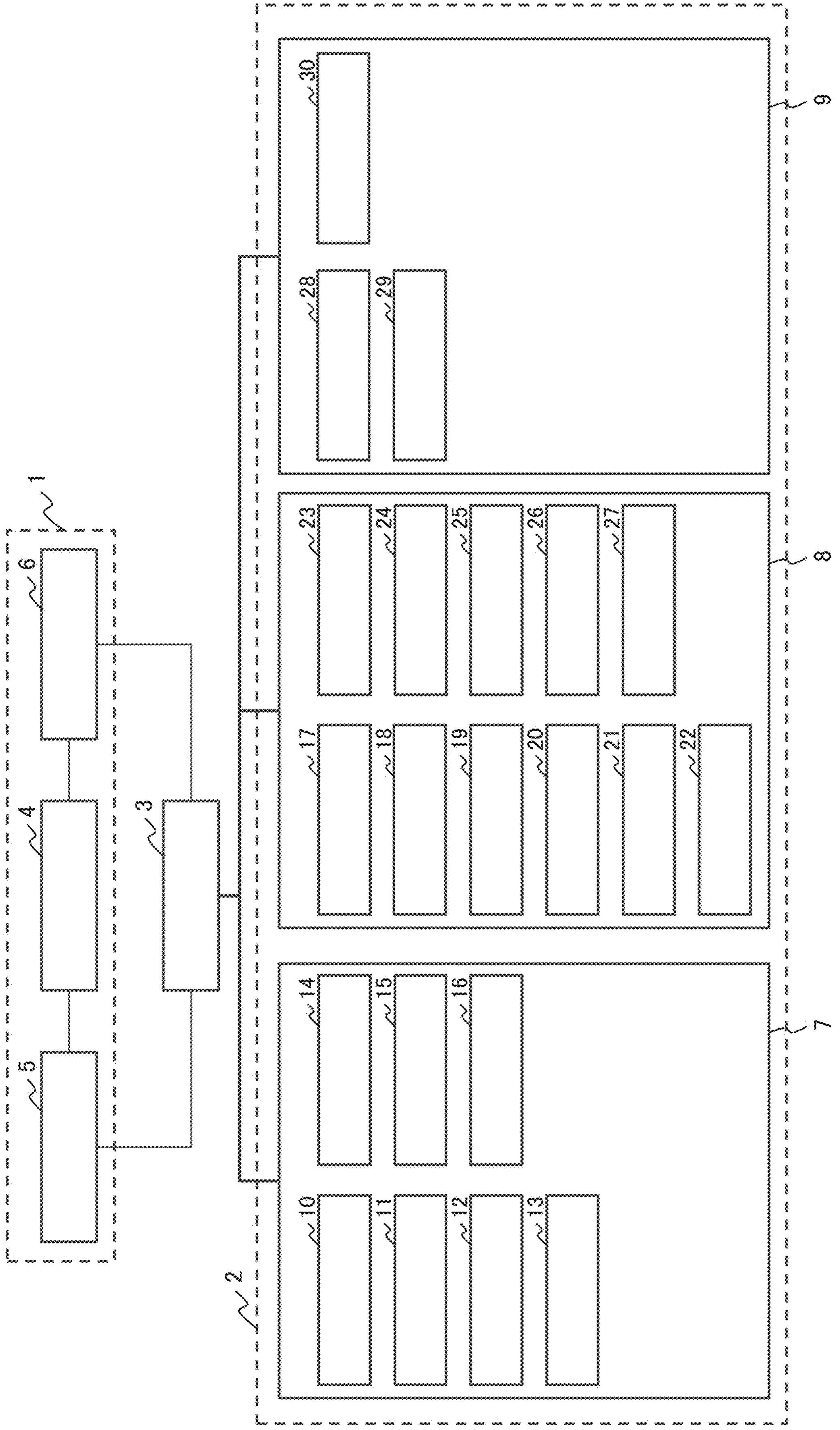
FIG. 1 is a diagram illustrating an overall configuration of a device for estimating a partial discharge factor of a power semiconductor module according to a first embodiment of the present invention.

FIG. 1 is a diagram illustrating an overall configuration of the device for estimating the partial discharge factor of the power semiconductor module according to the present embodiment.

As illustrated in FIG. 1, the device for estimating the partial discharge factor of the power semiconductor module according to the present embodiment includes, as main components, discharge test equipment 1, a computer server 2, and a communication unit 3 that connects the discharge test equipment 1 and the computer server 2 to each other.

The discharge test equipment 1 includes a current measurement unit 5 and a voltage applying unit 6. During a partial discharge test, an electronic device 4 to be subjected to a discharge test is connected to the current measurement unit 5 and the voltage applying unit 6, a test voltage is applied from the voltage applying unit 6 to the electronic device 4, and the current measurement unit 5 measures a value (quantity of charge) of a current flowing in the electronic device 4 and thus measures a quantity of charge that is due to partial discharge. The electronic device 4 corresponds to the power semiconductor module 31.

The computer server 2 includes an arithmetic unit 7, a storage unit 8, and a user interface unit (GUI) 9. FIG. 1 illustrates an example in which the arithmetic unit 7, the storage unit 8, and the user interface unit (GUI) 9 are disposed as the computer server 2 in the same space. However, the arithmetic unit 7, the storage unit 8, and the user interface unit (GUI) 9 may be disposed at different locations and connected to each other by a network.

The arithmetic unit 7 includes an inspection execution unit 10, a signal processing unit 11, the feature quantity calculation unit 12, a classification model generation unit 13, a factor classification unit 14, a result display execution unit 15, and a labeling execution unit 16.

The storage unit 8 includes a partial discharge test program 17, a feature quantity calculation program 18, a labeling program 19, a classification model generation program 20, a classification program 21, a result display program 22, a current signal storage unit 23, a feature quantity storage unit 24, a classification model generation data storage unit 25, a trained classification model storage unit 26, and a classification estimation result storage unit 27.

The user interface unit (GUI) 9 includes an input unit 28, a computer communication unit 29, and a display unit 30.

Figure 2A:
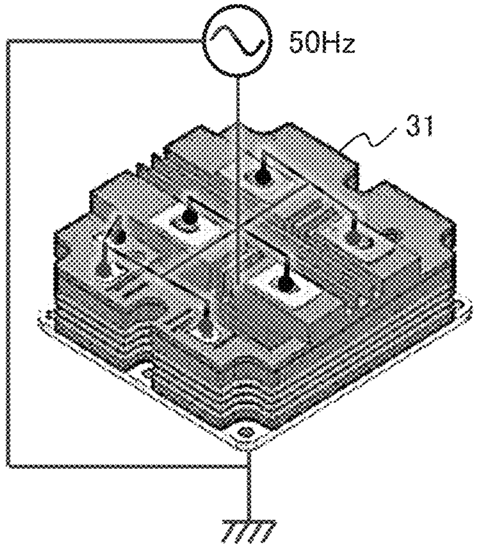
FIG. 2A is a perspective view of the power semiconductor module during a partial discharge test.
Figure 2B:
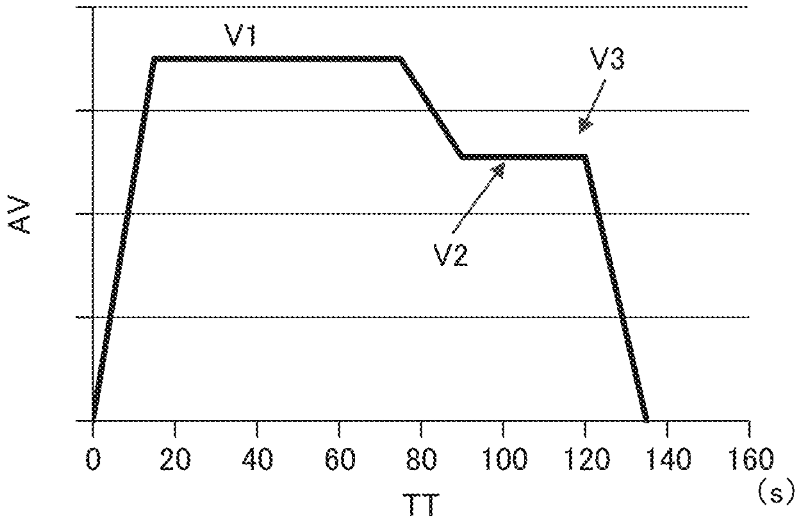
FIG. 2B is a diagram illustrating a representative example of a partial discharge test condition.
Figure 2C:
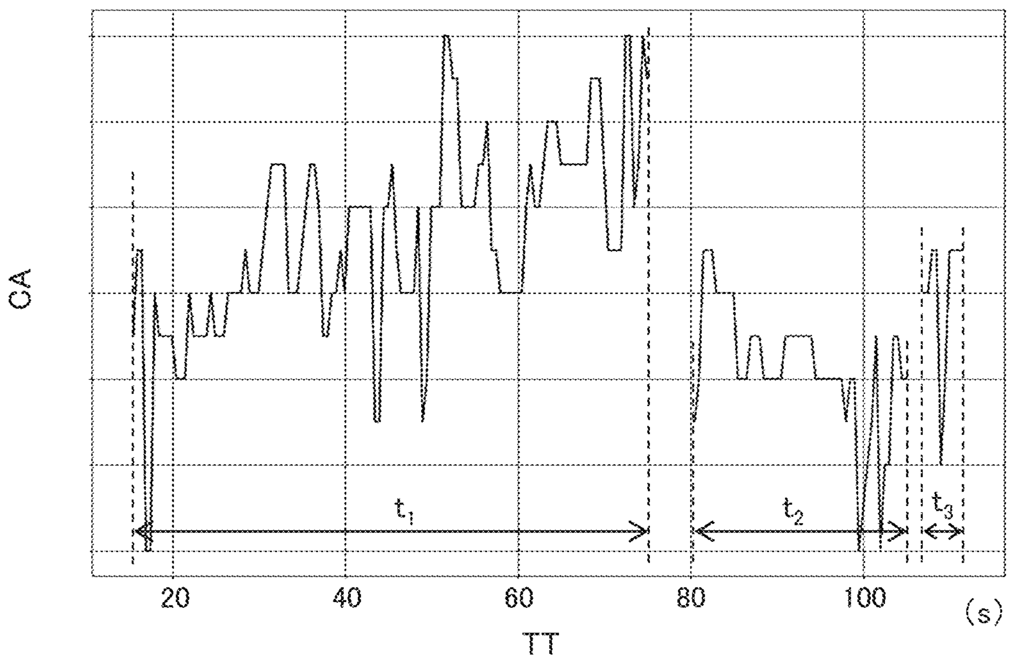
FIG. 2C is a diagram illustrating an example of a discharge pattern during the partial discharge test.

A basic concept of the present invention will be described with reference to FIGS. 2A to 2C. FIG. 2A is a perspective view of the power semiconductor module 31 during a partial discharge test. FIG. 2B is a diagram illustrating a representative example of a partial discharge test condition. FIG. 2C is a diagram illustrating an example of a discharge pattern during the partial discharge test.

As illustrated in FIG. 2A, during the partial discharge test, an alternating-current voltage is applied from the voltage applying unit 6 to the power semiconductor module 31 to be subjected to the test, and the current measurement unit 5 measures a current value (quantity of charge discharged).

As a test condition, for example, a test voltage is applied to the power semiconductor module 31 using a test voltage pattern in which a voltage pattern changes over time as illustrated in FIG. 2B. In FIG. 2B, the vertical axis represents the applied voltage AV, and the horizontal axis represents test time TT.

In the example illustrated in FIG. 2B, when the voltage is increased from the start of the test and reaches a predetermined voltage V1, the applied voltage V1 is maintained for a fixed time period (approximately 60 sec in FIG. 2B). Thereafter, when the voltage is reduced and reaches a predetermined voltage V2, the applied voltage V2 is maintained for a fixed time period (approximately 25 sec in FIG. 2B). Further, the voltage is maintained at a predetermined voltage V3 for a fixed time period (approximately 5 sec in FIG. 2B) and is reduced.

Although FIG. 2B illustrates that the voltage V2 and the voltage V3 are the same voltage, voltage values of the voltage V2 and the voltage V3 may be changed. The test condition (test voltage pattern) varies for each of product types of power semiconductor modules 31.

FIG. 2C illustrates a result of the test with the test voltage pattern illustrated in FIG. 2B. In FIG. 2C, the vertical axis represents a quantity CA of charge, and the horizontal axis represents test time TT.

In FIG. 2C, a time period (approximately 60 sec) for applying the voltage V1 of the test voltage pattern illustrated in FIG. 2B corresponds to a time period t1. In addition, a time period (approximately 25 sec) for applying the voltage V2 and a time period (approximately 5 sec) for applying the voltage V3 correspond to a time period t2 and a time period t3, respectively.

As illustrated in FIG. 2C, in the time period t1 for applying the relatively high voltage V1, the quantity CA of charge gradually increases while repeatedly increasing and decreasing. On the other hand, in the time period t2 for applying the voltage V2 lower than the voltage V1, the quantity CA of charge gradually decreases while repeatedly increasing and decreasing.

Time-series data (discharge pattern) of the quantity of charge discharged during the partial discharge test can be obtained by applying the test voltage to the power semiconductor module 31 using the test voltage pattern (FIG. 2B) in which the voltage pattern changes over time.

The partial discharge factor is estimated from the time-series data (discharge pattern) by comparing the time-series data (discharge pattern) of the quantity of charge discharged with past data stored in the feature quantity storage unit 24 and associating the time-series data with the partial discharge factor.

It is also possible to distinguish between the partial discharge factor depending on time and the partial discharge factor not depending on time by performing the partial discharge test again after the elapse of a predetermined time.

Figure 3:
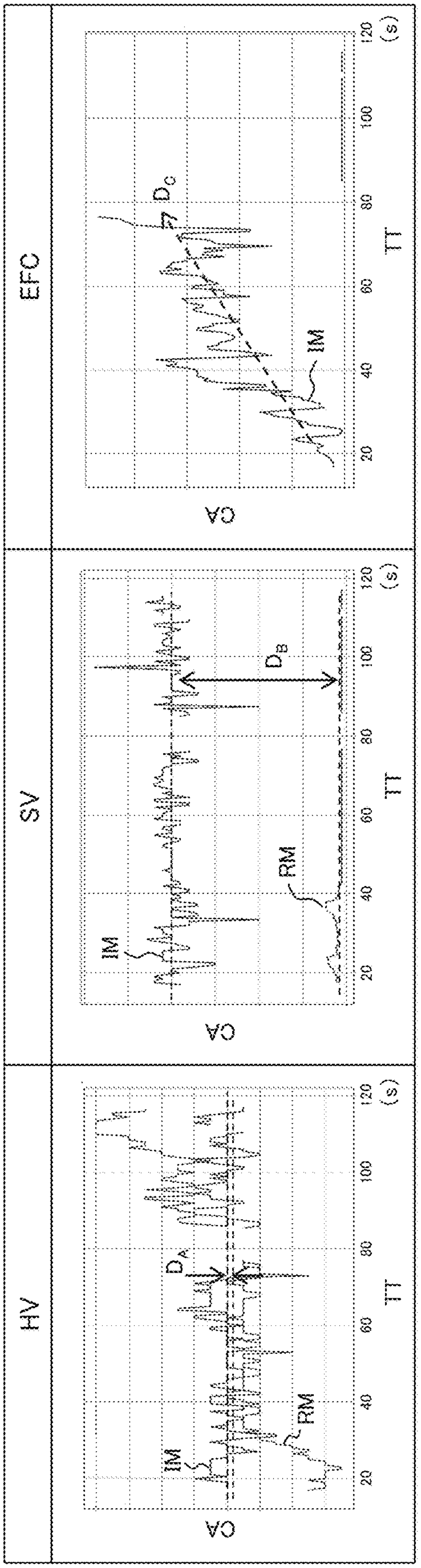
FIG. 3 is a diagram illustrating an example of a discharge pattern during the partial discharge test.

An example in which the time-series data (discharge pattern) of the quantity of charge discharged is associated with the partial discharge factor will be described with reference to FIG. 3. FIG. 3 is a diagram illustrating an example of the discharge pattern during the partial discharge test based on the past data.

HV, SV, and EFC illustrated in FIG. 3 indicate a void in hard resin, a void in soft resin, and a portion on which an electric field is concentrated, which are partial discharge factors. IM and RM in the drawing indicate initial measurement (first measurement) and remeasurement (second measurement).

In the case of the void HV in the hard resin, discharge occurs at the void present in the hard resin. The quantity of charge does not tend to increase during the application of the voltage, and there is a characteristic in which the diameter of the void hardly depends on time. In addition, as indicated by $D_A$ in the drawing, the difference between the initial measurement IM and the remeasurement RM is small.

In the case of the void SV in the soft resin, discharge occurs at the void present in the soft resin. The quantity of charge may increase during the application of the voltage, there is a characteristic in which the diameter of the void may decrease over time. In addition, as indicated by $D_B$ in the drawing, the difference between the initial measurement IM and the remeasurement RM is large.

In the case of the portion EFC on which the electric field is concentrated, discharge occurs when the soft resin locally breaks insulation at the portion on which the electric field is concentrated and that is an end portion of an electrode or the like. There is a characteristic in which the quantity of charge increases due to tree degradation during the application of the voltage, as indicated by $D_C$.

As described above, in partial discharge of the power semiconductor module 31, a discharge mechanism varies for each factor, and thus time-series data (discharge pattern) during the partial discharge test also varies.

There is a correlation between the size of a void and quantity of charge discharged based on the principle of partial discharge. For example, the size of the void SV in the soft resin may become smaller over time, but the size of the void HV in the hard resin hardly depends on time.

It is possible to perform measurement a plurality of times (for example, the initial measurement and the remeasurement), and distinguish between the void HV in the hard resin and the void SV in the soft resin by comparing feature quantities (for example, average values) indicating the magnitudes of quantities of charge.

Figure 4:
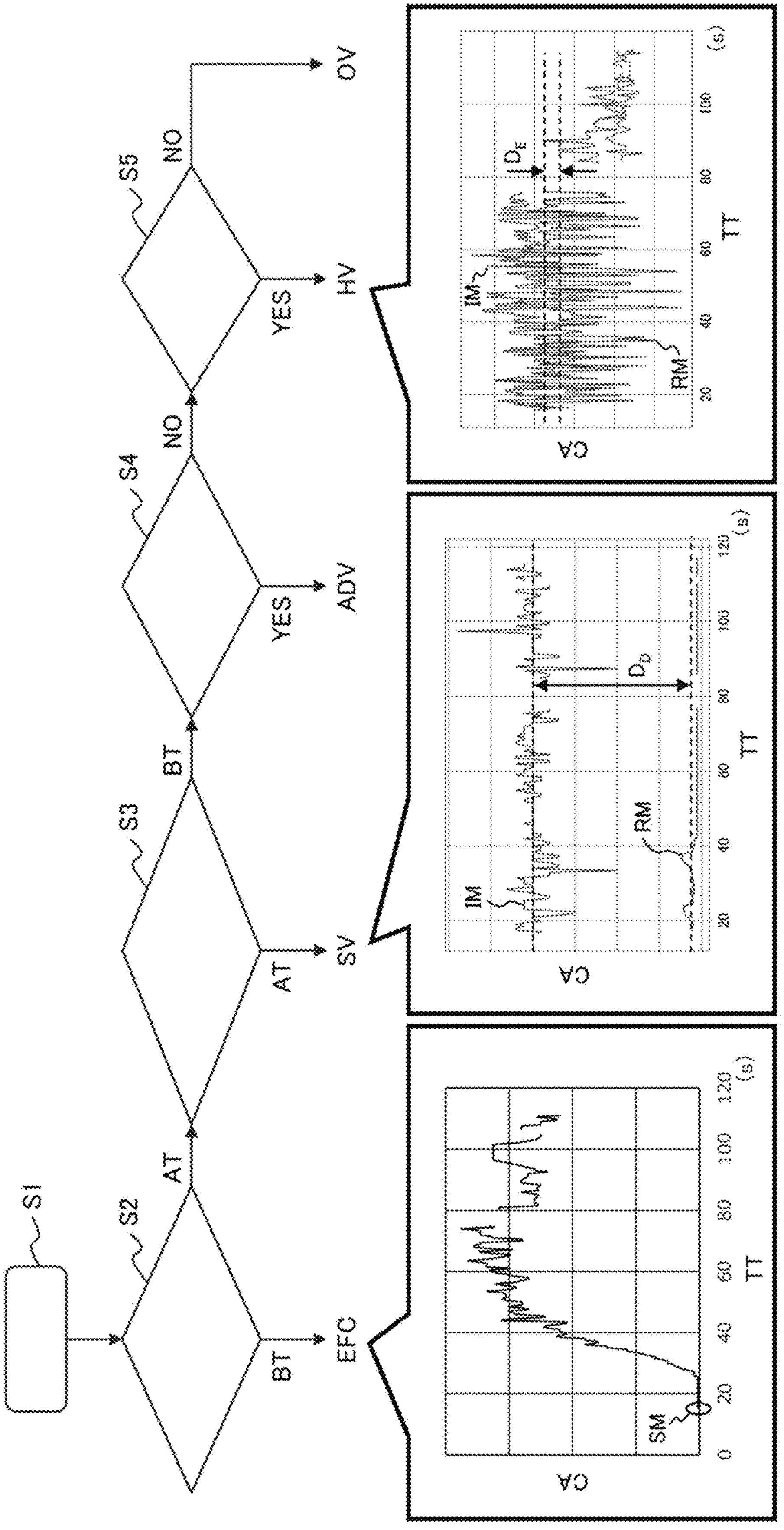
FIG. 4 is a diagram illustrating a threshold determination in a method for estimating the partial discharge factor of the power semiconductor module according to the first embodiment of the present invention.

The distinguishing of partial discharge factors by threshold determination will be described with reference to FIG. 4. FIG. 4 is a diagram illustrating a threshold determination in a method for estimating the partial discharge factor of the power semiconductor module according to the present embodiment.

First, in step S1, the determination is started.

Next, in step S2, the quantity of charge at the start time of the measurement is compared with a predetermined threshold. In a case where the quantity of charge is equal to or less than the predetermined threshold and increases over time in the same one measurement (BT), it is determined that a discharge factor is the portion EFC on which the electric field is concentrated. SM in the drawing indicates that the quantity of charge is equal to or less than the threshold at the start time of the measurement. As a method for determining whether the quantity of charge increases over time in the same one measurement, for example, in the same one measurement, a first feature quantity that is an average value of a quantity of charge in a first time period and a second feature quantity that is an average value of a quantity of charge in a second time period after the first time period are used, and in a case where the first feature quantity is greater than the second feature quantity by the predetermined threshold or more, it can be determined that the quantity of charge increases.

In a case where the quantity of charge exceeds the predetermined threshold (AT), the process proceeds to step S3, and the difference between average quantities of charge in the initial measurement and the remeasurement is compared with the predetermined threshold. In a case where the difference between the average quantities of charge in the initial measurement and the remeasurement exceeds the predetermined threshold (AT), it is determined that the discharge factor is the void SV in the soft resin. Dp in the drawing indicates that the difference between the average values exceeds the threshold. In this case, for example, the determination can be made by comparing the first feature quantity in the initial measurement IM with the first feature quantity in the remeasurement RM. Note that the determination may be made by comparing the second feature quantity in the initial measurement IM with the second feature quantity in the remeasurement RM. Alternatively, the first time period may be set as a predetermined time period in the initial measurement IM, the second time period may be set as a predetermined time period in the remeasurement RM corresponding to the first time period in the initial measurement IM, and the determination may be made by comparing the first feature quantity in the initial measurement IM with the second feature quantity in the remeasurement RM. However, in this case, the determination in step S2 cannot be made, and thus it is desirable to extract the first feature quantity and the second feature quantity in the initial measurement IM and the first feature quantity and the second feature quantity in the remeasurement RM. Therefore, both of the determinations in steps S2 and S3 can be made.

In a case where the difference between the average quantities of charge in the initial measurement and the remeasurement is equal to or less than the predetermined threshold (BT), the process proceeds to step S4 to determine whether or not the auxiliary terminal 92 of the casing 88 is present. In a case where it is determined that the auxiliary terminal 92 is present (YES), it is determined that the discharge factor is a void ADV in an adhesive.

In a case where it is determined that the auxiliary terminal 92 is not present (NO), the process proceeds to step S5 to determine whether or not the hard resin is present. In a case where it is determined that the hard resin is present (YES), it is determined that the discharge factor is the void HV in the hard resin. $D_E$ in the drawing indicates that the difference between the average values is equal to or less than the threshold.

In a case where it is determined that the hard resin is not present (NO), it is determined that the discharge factor is another factor OV. The other factor OV includes, for example, a factor other than the voids, such as looseness of a screw.

According to the method for estimating the partial discharge factor of the power semiconductor module and the device for estimating the partial discharge factor of the power semiconductor module according to the present embodiment described above, it is possible to easily and automatically estimate the partial discharge factor using time-series data of a quantity of charge discharged during a partial discharge test.

Second Embodiment

A method for estimating the partial discharge factor of the power semiconductor module and the device for estimating the partial discharge factor of the power semiconductor module according to a second embodiment of the present embodiment will be described with reference to FIGS. 5 and 6. In the present embodiment, the classification of the partial discharge factor using machine learning will be described.

Figure 5:
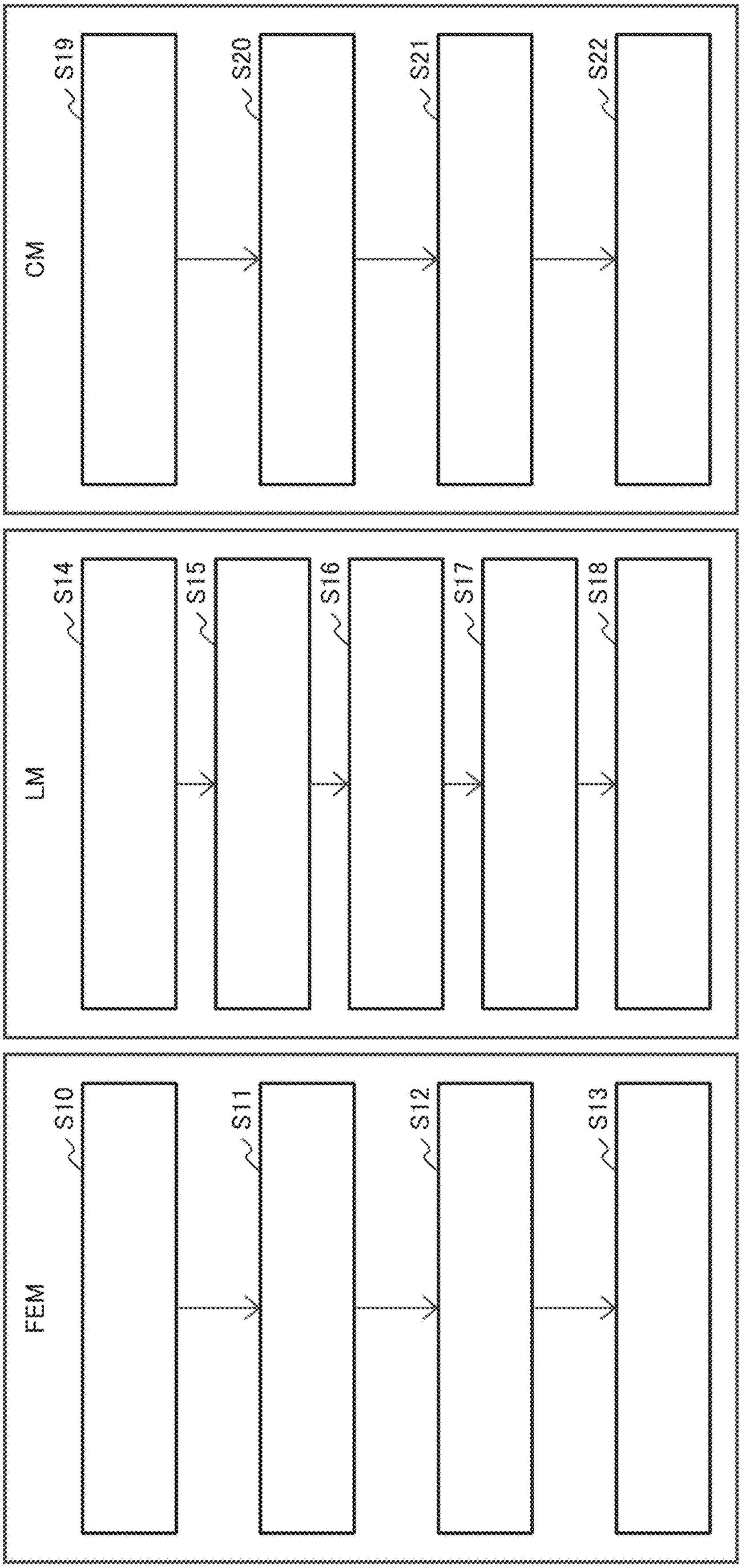
FIG. 5 is a diagram illustrating a process procedure in each of a feature quantity calculation unit, a learning execution unit, and a factor classification unit of the device for estimating the partial discharge factor of the power semiconductor module according to a second embodiment of the present invention.

FIG. 5 is a diagram illustrating a process procedure in each of the feature quantity calculation unit, a learning execution unit, and the factor classification unit of the device for estimating the partial discharge factor of the power semiconductor module according to the present embodiment.

As illustrated in FIG. 5, in the feature quantity calculation unit, a feature quantity extraction mode FEM is executed.

First, in step S10, time-series data of a partial discharge test for a target ID (product type, lot, and the like) is extracted from the current signal storage unit 23.

Next, in step S11, an applied voltage profile of the partial discharge test defined in the partial discharge test program 17 is extracted.

Subsequently, in step S12, a feature quantity (e.g., an average value) of time-series is calculated for each desired region of the applied voltage profile. In this case, feature quantities during a plurality of tests may be calculated.

Lastly, in step S13, the feature quantity is associated with information of the target ID and stored in the feature quantity storage unit 24.

In addition, in the learning execution unit, a learning mode LM is executed.

First, in step S14, a data set in which the feature quantity is associated with a discharge factor is extracted from a learning data storage unit.

Next, in step S15, pre-processing such as conversion of a categorical variable into a dummy variable and standardization of a continuous variable is performed.

Subsequently, in step S16, at least one or more models for classifying a factor by a machine learning algorithm are generated for the data set after the pre-processing.

Next, in step S17, a best classification model with the highest accuracy of classifying factors is selected from a group of the generated one or more models. In this case, ensemble learning using a plurality of machine learning algorithms can be used.

Lastly, in step S18, the best classification model and a parameter regarding the pre-processing are stored in the trained classification model storage unit 26.

In addition, in the factor classification unit, a classification mode CM is executed.

First, in step S19, a trained model and the parameter regarding the pre-processing are extracted from the trained classification model storage unit 26.

Next, in step S20, feature quantity data of a partial discharge test of a desired ID is extracted from a classification data storage unit.

Subsequently, in step S21, a probability of belonging to the discharge factor and each factor are calculated from the feature quantity data, the trained model, and the parameter regarding the pre-processing.

Lastly, in step S22, the result of calculating the probability of belonging to the discharge factor and each factor is associated with an ID and stored in the classification estimation result storage unit 27.

A basic concept of a factor classification method using machine learning will be described with reference to FIG. 6. FIG. 6 is a diagram conceptually illustrating a method for classifying a factor using machine learning according to the present embodiment.

Figure 6:
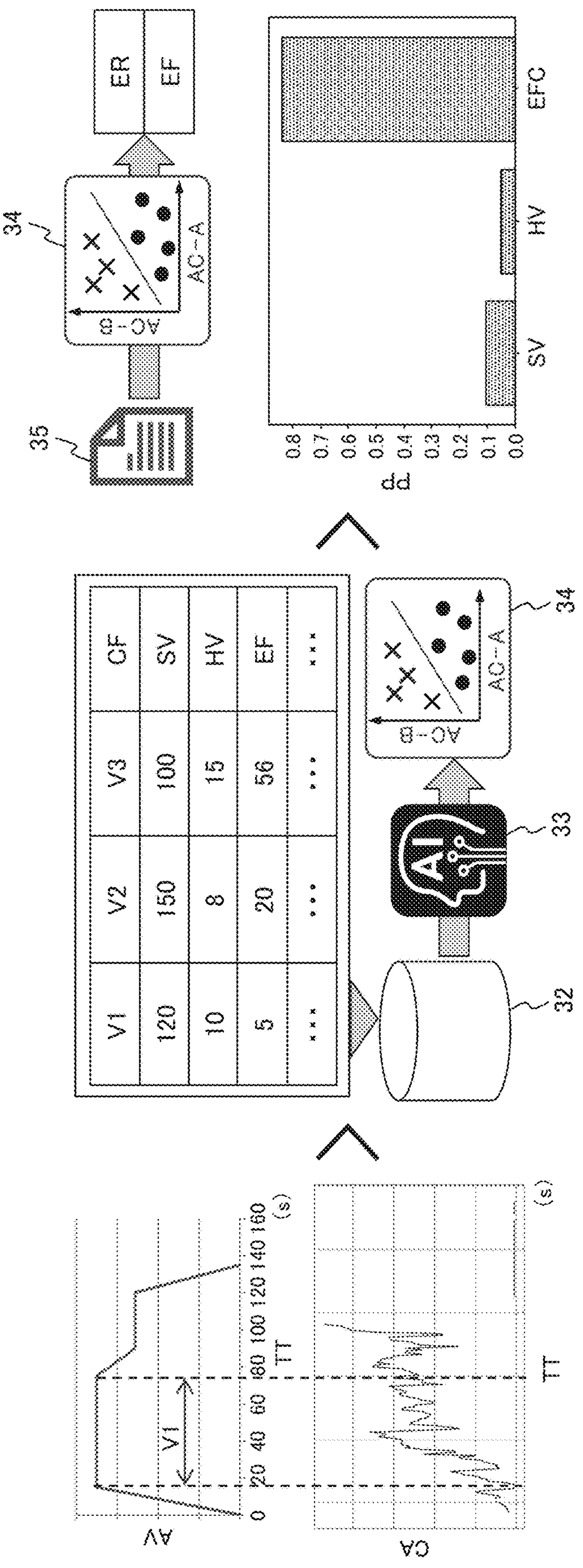
FIG. 6 is a diagram conceptually illustrating a method for classifying a factor using machine learning according to the second embodiment of the present invention.

First, as illustrated in the left diagram in FIG. 6, a feature quantity is extracted from data including the test condition stored therein and data of the quantity of charge discharged. An example illustrated in FIG. 6 assumes an example in which an average value of the test voltage V1 is calculated.

Next, as illustrated in the middle diagram in FIG. 6, a classification model is generated by machine learning based on a learning data set in which a feature quantity is associated with a factor. CF and EF illustrated in the middle diagram in FIG. 6 indicate a factor and electric field concentration, respectively.

A trained model 34 is generated by acquiring the learning data set in which the feature quantity is associated with the factor from a learning database 32 and performing machine learning using a classification algorithm 33. AC-A and AC-B of the trained model 34 indicate a feature quantity A and a feature quantity B, respectively.

As illustrated in the right diagram in FIG. 6, a factor is estimated using the trained classification model 34 from a new discharge pattern 35 caused by an unknown factor, and information indicating that the factor is the electric field concentration EF as an estimation result ER. A predicted probability PP at this time is as illustrated in the right diagram in FIG. 6.

Third Embodiment

Figure 7:
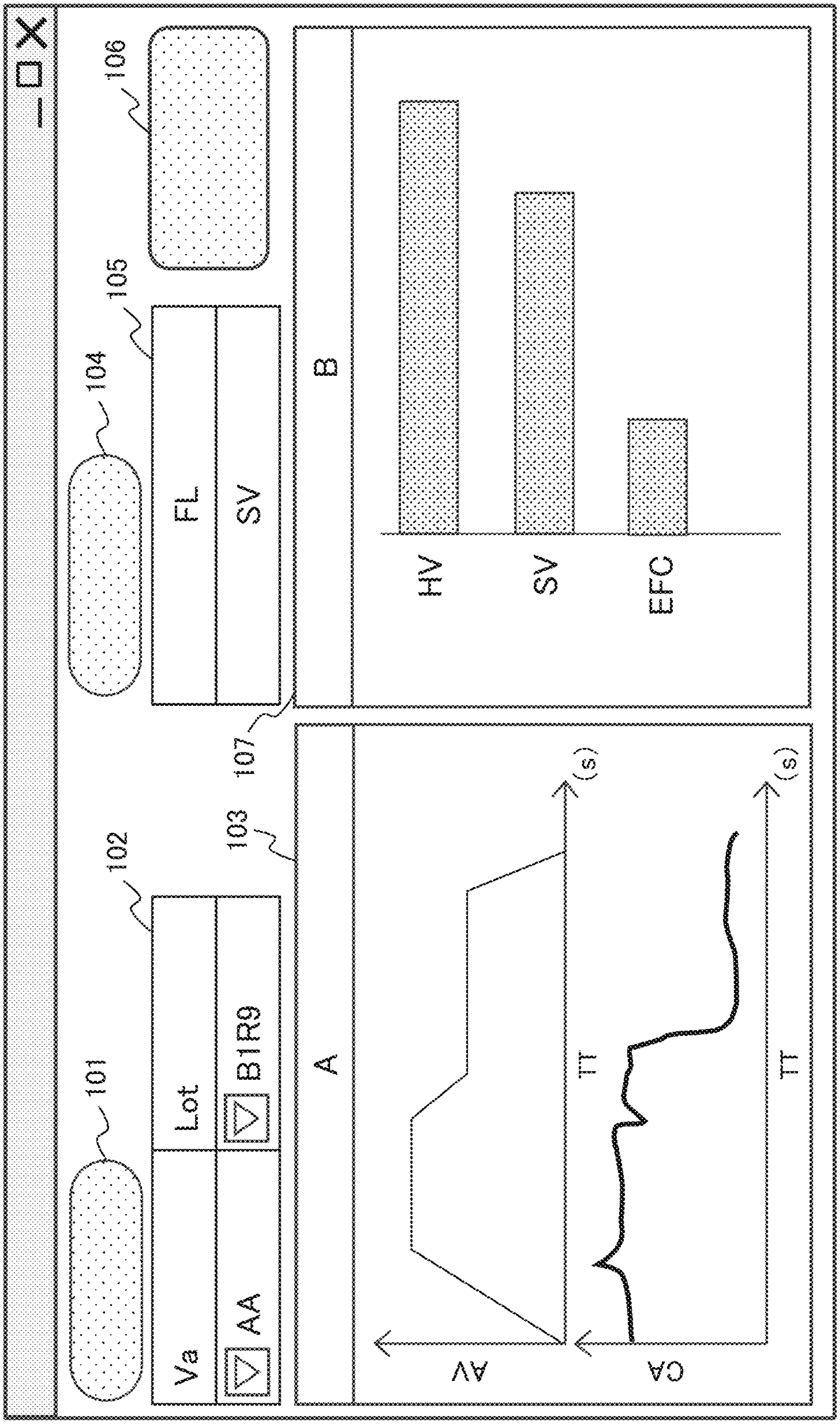
FIG. 7 is a diagram illustrating a GUI of the device for estimating the partial discharge factor of the power semiconductor module according to a third embodiment of the present invention.

A method for estimating the partial discharge factor of the power semiconductor module and the device for estimating the partial discharge factor of the power semiconductor module according to a third embodiment of the present embodiment will be described with reference to FIG. 7. The present embodiment describes an example of a graphical user interface (GUI) that outputs an estimation result ER. FIG. 7 is a diagram illustrating a GUI of the device for estimating the partial discharge factor of the power semiconductor module according to the present embodiment.

As illustrated in FIG. 7, in the GUI, a display button 101, a product type/lot selection section 102, an applied voltage profile/charge quantity display section 103, a register button 104, a factor label input section 105, a relearn button 106, and a discharge factor classification result display section 107 are displayed. A user can use the GUI to perform inputting to the device for estimating the partial discharge factor of the power semiconductor module.

For example, in a case where the partial discharge factor is to be checked, a target product type Va and a lot Lot are selected in the product type/lot selection section 102 and the display button 101 is pressed. FIG. 7 illustrates an example of selecting "AA" as the product type Va and "B1R9" as the lot Lot.

As a result, in the applied voltage profile/charge quantity display section 103, an applied voltage profile of the lot B1R9 of the product type AA selected in the product type/lot selection section 102 and raw data of a quantity A of charge discharged are displayed. At the same time as this (as a set), a discharge factor classification result B is displayed in the discharge factor classification result display section 107. FIG. 7 illustrates, as an example of the discharge factor classification result B, probabilities of the void SV in the soft resin, the void HV in the hard resin, and the portion EFC on which the electric field is concentrated.

In addition, for example, in a case where the classification of partial discharge factors using the machine learning described in the second embodiment is to be performed again (relearning), the relearning can be performed by the user inputting, to the factor label input section 105, a desired factor to be registered, pressing the register button 104 to register the factor, and pressing the relearn button 106. FIG. 7 illustrates an example of the input to the factor label input section 105, and an example in which the void SV in the soft resin is input to a factor label FL.

The present invention is not limited to the embodiments described above and includes various modification examples. For example, the embodiments are described above in detail to clearly explain the present invention, and are not necessarily limited to including all the configurations described above. In addition, part of the configuration of one example can be replaced with the configurations of other examples, and in addition, the configuration of the one example can also be added with the configurations of other examples. In addition, part of the configuration of each of the examples can be subjected to addition, deletion, and replacement with respect to other configurations.

LIST OF REFERENCE SIGNS

1: discharge test equipment, 2: computer server, 3: communication unit, 4: electronic device (subjected to discharge test), 5: current measurement unit, 6: voltage applying unit, 7: arithmetic unit, 8: storage unit, 9: user interface unit (GUI), 10: inspection execution unit, 11: signal processing unit, 12: feature quantity calculation unit, 13: classification model generation unit, 14: factor classification unit, 15: result display execution unit, 16: labeling execution unit, 17: partial discharge test program, 18: feature quantity calculation program, 19: labeling program, 20: classification model generation program, 21: classification program, 22: result display program, 23: current signal storage unit, 24: feature quantity storage unit, 25: classification model generation data storage unit, 26: trained classification model storage unit, 27: classification estimation result storage unit, 28: input unit, 29: computer communication unit, 30: display unit, 31: power semiconductor module, 32: learning database, 33: classification algorithm, 34: trained model, 35: new discharge pattern, 81: semiconductor chip, 82: solder, 83: metal wire, 84: insulating substrate, 85: metal wire, 86: solder, 87: heat dissipation base plate, 88: case, 89: lid, 90: adhesive, 91: soft resin, 92: auxiliary terminal, 93: bonding wire, 94: hard resin, 101: display button, 102: product type/lot selection section, 103: applied voltage profile/charge quantity display section, 104: register button, 105: factor label input section, 106: relearn button, 107: discharge factor classification result display section, AV: applied voltage, TT: test time, CA: quantity of charge, HV: hard resin void, SV: soft resin void, ADV: adhesive void, OV: other factor, EFC: portion on which the electric field is concentrated, EF: electric field concentration, IM: initial measurement, RM: remeasurement, $D_A$: difference is small, $D_B$: difference is large, $D_C$: increase due to tree degradation, $D_D$: difference between average values exceeds threshold, $D_E$: difference between average values is equal to or less than threshold, AT: exceed threshold, BT: equal to or less than threshold, SM: equal to or less than threshold at start time of measurement, FEM: feature quantity extraction mode, LM: learning mode, CM: classification mode, CF: factor, AC: feature quantity, ER: estimation result, PP: predicted probability, Va: product type, Lot: lot, FL: factor label, A: applied voltage profile and quantity of charge discharged, B: discharge factor classification result, P1 to P5: partial discharge, S1: start determination, S2: determine quantity of charge at start time of measurement, S3: determine difference between average quantities of charge in initial measurement and remeasurement, S4: determine whether or not auxiliary terminal is present, S5: determine whether or not hard resin is present

The invention claimed is:

1. A method for estimating a partial discharge factor of a power semiconductor module during a partial discharge test, the method comprising:

(a) applying, to the power semiconductor module, a test voltage pattern that includes changing, over time, an applied voltage according to a predetermined voltage profile, and measuring a quantity of charge caused by partial discharge of the power semiconductor module during application of the test voltage pattern to the power semiconductor module;

(b) dividing the measured quantity of charge into a plurality of time periods corresponding to different voltage application regions of the test voltage pattern, and determining a plurality of feature quantities including (i) a first feature quantity obtained by averaging the measured quantity of charge during a first voltage holding period, and (ii) a second feature quantity obtained by averaging the measured quantity of charge during a second voltage holding period, different from the first voltage holding period; and (c) estimating a physical partial discharge factor selected from a plurality of partial discharge mechanisms specific to the power semiconductor module, and based on a temporal change relationship determined between the first feature quantity and the second feature quantity, wherein the estimating includes determining whether the partial discharge is caused by a soft resin void, a hard resin void, or an electric field concentration inside the power semiconductor module.

2. The method for estimating the partial discharge factor of the power semiconductor module according to claim 1, wherein in the step (a), at least two measurements are performed over time, wherein a second measurement is performed after a predetermined time elapses following performing of a first measurement, in the step (b), the first feature quantity is obtained base at least in part on the first measurement and the second feature quantity is obtained based at least in part on the second measurement, and in the step (c), the partial discharge factor is estimated using the first feature quantity obtained based at least in part on the first measurement and the second feature quantity obtained based at least in part on the second measurement.

3. The method for estimating the partial discharge factor of the power semiconductor module according to claim 2, wherein in the step (b), a plurality of the first feature quantities are obtained based at least in part on the first measurement and a plurality of the second feature quantities are obtained based at least in part on the second measurement, and in the step (c), the partial discharge factor is estimated using the plurality of the first feature quantities obtained based at least in part on the first measurement and the plurality of the second feature quantities obtained based at least in part on the second measurement.

4. The method for estimating the partial discharge factor of the power semiconductor module according to claim 2, wherein in the step (c), in a case where a difference between the first feature quantity obtained based at least in part on the first measurement and the second feature quantity obtained based at least in part on the second measurement is equal to or greater than a predetermined threshold, the partial discharge factor is estimated to be caused by a void in soft resin.

5. The method for estimating the partial discharge factor of the power semiconductor module according to claim 1, the method further comprising:

(d) extracting, from a learning database, a learning data set in which a feature quantity is associated with a discharge factor; and (e) generating, based at least on the learning data set, at least one or more models for classifying a partial discharge factor by a machine learning algorithm, wherein in the step (c), the partial discharge factor is estimated using the one or more models for classifying a partial discharge factor generated in the step (e).

6. The method for estimating the partial discharge factor of the power semiconductor module according to claim 5, wherein the test voltage pattern and the estimated partial discharge factor are displayed as a set in a graphical user interface (GUI).

7. The method for estimating the partial discharge factor of the power semiconductor module according to claim 6, wherein based at least on a user registering a desired discharge factor using the GUI, relearning is instructed and performed by the step (e) for the learning data set including the registered discharge factor.

8. A device for estimating a partial discharge factor of a power semiconductor module during a partial discharge test, the device comprising:

a computer in communication with a voltage applying unit and a current measurement unit, the computer configured by one or more executable programs to perform operations that include:

causing the voltage applying unit to apply, to the power semiconductor module, a test voltage pattern that includes changing, over time, an applied voltage according to a predetermined voltage profile;

causing the current measurement unit to measure a quantity of charge caused by partial discharge of the power semiconductor module during application of the test voltage pattern to the power semiconductor module;

dividing the measured quantity of charge into a plurality of time periods corresponding to different voltage application regions of the test voltage pattern;

determining a plurality of feature quantities including at least a first feature quantity that is obtained by averaging the measured quantity of charge during a first voltage holding period, and a second feature quantity that is obtained by averaging the measured quantity of charge during a second voltage holding period, different from the first voltage holding period; and estimating a physical partial discharge factor selected from a plurality of partial discharge mechanisms specific to the power semiconductor module, and based on a temporal change relationship determined between the first feature quantity and the second feature quantity, wherein the estimating includes determining whether the partial discharge is caused by a soft resin void, a hard resin void, or an electric field concentration inside the power semiconductor module.

9. The device for estimating the partial discharge factor of the power semiconductor module according to claim 8, the device further comprising:

a non-transitory computer-readable storage medium;

the operations further comprising determining, from the non-transitory computer-readable storage medium, a learning data set in which a feature quantity is associated with a discharge factor;

generating one or more models for classifying a partial discharge factor by a machine learning algorithm for the learning data set; and estimating the partial discharge factor using the one or more models for classifying a partial discharge factor generated based on the learning data set.

10. The device for estimating the partial discharge factor of the power semiconductor module according to claim 9, the operations further comprising presenting a graphical user interface (GUI) that displays the test voltage pattern and the estimated partial discharge factor as a set.

11. The device for estimating the partial discharge factor of a power semiconductor module according to claim 10, the operations further comprising:

based on receiving a user registration of a desired discharge factor via the GUI, performing relearning of the classification model using the learning data set including the registered discharge factor.

* * * * *